United States Patent
Chiang et al.

(10) Patent No.: US 6,949,450 B2
(45) Date of Patent: *Sep. 27, 2005

(54) METHOD FOR INTEGRATED IN-SITU CLEANING AND SUBSEQUENT ATOMIC LAYER DEPOSITION WITHIN A SINGLE PROCESSING CHAMBER

(75) Inventors: Tony P. Chiang, Santa Clara, CA (US); Karl F. Leeser, Sunnyvale, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/994,279

(22) Filed: Nov. 26, 2001

(65) Prior Publication Data

US 2002/0068458 A1 Jun. 6, 2002

Related U.S. Application Data

(60) Provisional application No. 60/255,812, filed on Dec. 15, 2000, and provisional application No. 60/254,280, filed on Dec. 6, 2000.

(51) Int. Cl.[7] .......................................... H01L 21/322
(52) U.S. Cl. ...................... 438/475; 438/680; 438/935
(58) Field of Search .............................. 438/475, 216, 438/485, 677, 692, 680, 681, 710, 714, 745, 758, 706, 905, 906, 935, 800

(56) References Cited

U.S. PATENT DOCUMENTS

| | | | |
|---|---|---|---|
| 4,951,601 A | * | 8/1990 | Maydan et al. ............ 118/719 |
| 5,403,434 A | * | 4/1995 | Moslehi ...................... 156/643 |
| 5,702,530 A | | 12/1997 | Shan et al. |
| 5,834,371 A | | 11/1998 | Ameen et al. |
| 5,916,365 A | * | 6/1999 | Sherman ....................... 117/92 |
| 5,963,833 A | * | 10/1999 | Thakur ....................... 438/677 |
| 6,103,304 A | * | 8/2000 | Mizuno .................... 427/248.1 |
| 6,110,836 A | | 8/2000 | Cohen et al. |
| 6,143,128 A | | 11/2000 | Ameen et al. |
| 6,200,893 B1 | * | 3/2001 | Sneh .......................... 438/685 |
| 6,416,822 B1 | * | 7/2002 | Chiang et al. .............. 427/561 |
| 6,428,859 B1 | * | 8/2002 | Chiang et al. .............. 427/457 |
| 6,569,501 B2 | * | 5/2003 | Chiang et al. .............. 427/535 |

* cited by examiner

Primary Examiner—David Nhu
(74) Attorney, Agent, or Firm—Patent Law Group LLP

(57) ABSTRACT

A system and sequential method for integrated, in-situ modification of a substrate and subsequent atomic layer deposition of a thin film onto the substrate in an evacuated chamber includes introducing at least one feed gas into the chamber; generating a plasma from the feed gas; exposing said substrate to ions and/or radicals formed by the plasma; modulating any ions; reacting the substrate with said modulated ions and/or radicals to remove any contaminants from the substrate and producing a modified substrate. These steps are followed, in-situ, by performing an atomic layer deposition of a thin film onto the modified substrate in the chamber including introducing a first reactant gas into said chamber; adsorbing at least one monolayer of the first reactant gas onto the modified substrate; evacuating any excess first reactant gas from the chamber; introducing at least one additional feed gas into the chamber, generating a second plasma from the additional feed gas; exposing the modified substrate to additional ions and/or radicals formed by the plasma; modulating any additional ions; and reacting the adsorbed monolayer of the first reactant gas with any modulated additional ions and/or radicals to deposit the thin film.

18 Claims, 7 Drawing Sheets

METHOD FOR INTEGRATED IN-SITU CLEANING AND SUBSEQUENT ATOMIC LAYER DEPOSITION WITHIN A SINGLE PROCESSING CHAMBER

CROSS-REFERENCE TO RELATED APPLICATIONS

This application claims the benefit of U.S. Provisional Application No. 60/254,280, filed Dec. 6, 2000, U.S. Provisional Application No. 60/255,812, filed Dec. 15, 2000, and U.S. application Ser. No. 09/812,352, filed Mar. 19, 2001.

BACKGROUND OF THE INVENTION

The present invention relates generally to the field of advanced thin film deposition methods commonly used in the semiconductor, data storage, flat panel display, as well as allied or other industries. More particularly, the present invention relates to an in-situ preclean apparatus and technique suitable for cleaning and treatment of high aspect ratio features prior to the deposition of conductive, semiconductive, and non-conductive thin films via modulated ion-induced atomic layer deposition (MII-ALD).

BRIEF DESCRIPTION OF THE PRIOR ART

Semiconductor integrated circuit (IC) manufacturing is a layer-by-layer process utilizing a series of deposition and etching steps. Lines ("trenches") and/or holes ("vias") are used to connect one portion of a circuit to another portion, or one layer to another layer. In aluminum (Al) metallization, a blanket Al film is patterned by means of etch removal processes into metal lines and subsequently isolated using dielectric gap fill processes. The dielectric serves as an insulator. In order to electrically connect an underlying Al layer with an overlying Al layer, vias are patterned into the dielectric and are subsequently filled with a metal conductor (e.g., tungsten). In copper (Cu) metallization, both trenches and vias are patterned into the dielectric and subsequently filled with a metal conductor (e.g., copper). The trenches and vias can be patterned and filled with metal separately (referred to as "single damascene") or concurrently (referred to as "dual damascene").

In both aluminum and copper metallization schemes, vias are used to connect an overlying metal layer to an underlying metal layer. However, a critical cleaning step must be performed prior to metal via fill in order to ensure a reliable, low resistance electrical connection between the overlying and underlying metal layers. This cleaning is necessary because, prior to via fill, the underlying metal conductor is exposed to byproducts resulting from the etching process used to define the vias. In addition, oxidation of the exposed underlying metal occurs due to exposure to atmosphere or to any oxygen-containing environment. If the via is used to "contact" the device silicon, then oxidation of the silicon surface can occur. These oxides (e.g., oxides of Al, Cu, or Si) and residue (e.g., carbonaceous residue from the resist mask used during the etching process) cause poor electrical connection (i.e., high via or contact resistance) and poor reliability (e.g., early electromigration failure).

Wet chemical etching such as buffered oxide etch (BOE) or hydrofluoric acid dip processes performed at atmospheric pressure have been used to clean the patterned dielectric features prior to metal fill. However, as device geometries have decreased to 0.25 $\mu$m and below, the aspect ratio (defined as the via depth to diameter ratio) of vias has increased. This makes wet etching inadequate and unattractive due to its inability to clean the bottoms of deep narrow vias and the possibility of contamination from particulates in the cleaning solution. As a result, argon (Ar) plasma etching performed in vacuum has been used more recently to clean the bottoms of vias prior to metal fill.

Argon plasma etching is essentially a physical sputtering process whereby energetic argon ions ($Ar^+$) are used to sputter (i.e., physically knock-off) unwanted material such as oxides, carbonaceous residue, and other impurities. Argon sputtering is more efficient at cleaning the bottoms of vias than wet chemical etching. However, when aspect ratios are high (e.g., greater than 4:1), unwanted material sputtered from the bottoms of vias can redeposit onto the via sidewalls. This effect will lead to poor mechanical adhesion between subsequently deposited metal film(s) and the contaminated dielectric via sidewalls. In copper metallization, these redeposited sidewall contaminants can lead to sidewall voiding during the copper electroplating fill process, thus reducing the effective via cross-sectional area. A decrease in the copper cross-sectional area will reduce its current carrying capacity. In addition, sidewall contaminants that are not removed are incorporated as undesirable material inclusions, poisoning the via fill-metal. Both of these effects serve to increase the overall via resistance, degrade device performance, and reduce interconnect reliability. A further drawback with argon physical sputtering is that the shapes of patterned features can be altered which may impact device design rules. As an example, the tops of the vias are preferentially etched and can become grossly rounded (see FIG. 3B).

A reactive preclean (U.S. Pat. No. 6,110,836) has been proposed to solve the aforementioned issues with pure argon sputtering. A halogen or hydrogen containing plasma is used to create a process dominated by chemical etching instead of physical sputtering. The halogen or hydrogen containing species reacts readily with oxides to form oxygen-containing byproducts, which can then be pumped away.

Following the cleaning process, whether it be wet chemical, argon sputtering, or reactive preclean, the substrate must not be exposed to any oxygen or impurity-containing ambients (e.g., C, Cl, F, etc.). If such exposure does occur, then the undesired native oxide and/or contamination will again form on the freshly cleaned substrate interfaces thus defeating the purpose of the preceding step as a preparation for subsequent deposition. Yet this is often the case when such cleaning methods and deposition processes are employed on separate machines or tools (e.g., in the case of wet cleaning) or at separate stations on the same cluster tool (e.g., in the case of argon sputtering or reactive preclean) with wafer transfers occurring between steps.

In order to resolve this issue, it is highly desirable to have an in-situ cleaning process within the same processing chamber as the subsequent deposition step. This is preferable to having a separate cleaning chamber connected via a vacuum transfer apparatus to a separate deposition chamber. Separate cleaning chambers can have materials present in the background ambient environment, even at reduced pressures, which can adversely influence interfacial properties (e.g., adhesion to and/or crystal orientation of the subsequent film(s) to be deposited) of both the patterned dielectric and the exposed underlying conductor. Background ambient environments still contain outgassed impurities and/or contaminants (e.g., water vapor, fluorine, carbonaceous residue, etc.) removed during the previous processing steps (e.g., degas or preclean). This is especially important to low dielectric constant ("low-k") insulator integration with copper metallization. Low-k materials are moisture sensitive in that they absorb water easily, which increases their effective dielectric constant (a low dielectric constant is desired because it reduces cross-talk between closely spaced signal carrying metal lines and leads to faster signal propagation).

In addition, low-k dielectric films exhibit weaker adhesion properties than traditional silicon dioxide. As an example, fluorine-doped $SiO_2$ (FSG) suffers from poor adhesion properties due to weakly bonded interfacial fluorine (F). Fluorine will attack tantalum (Ta) based materials commonly used as diffusion barriers for copper. A diffusion liner material is deposited into trenches and vias prior to copper seed layer deposition. The diffusion layer serves to prevent copper diffusion and also acts as a glue layer to promote adhesion of the copper seed layer to the dielectric. Fluorine attack will compromise the effectiveness of the diffusion layer, leading to poor barrier performance, high via resistance, Cu void formation during electroplating, and delamination (peeling) during chemical mechanical planarization (CMP). It is highly desirable to have a means of performing an in-situ preclean/surface treatment step immediately prior to the barrier deposition within the same processing chamber. The method should be effective at low substrate temperatures due to the comparably lower thermal stability of low-k materials (many low-k materials with k less than 2.5 are only stable at temperatures no higher than 200° C. to 300° C.) as compared to traditional silicon based oxides.

In addition, it is desirable that such an integrated in-situ preclean process does not introduce any added complexity to the overall process or compromise the throughput of the deposition chamber. Moreover, the integrated in-situ cleaning method should be able to clean and treat the bottoms and sidewalls of high aspect ratio vias and trenches without redeposition or significant change in feature profiles.

SUMMARY OF THE INVENTION

The present invention relates to an in-situ preclean apparatus and technique suitable for cleaning and treatment of high aspect ratio features prior to the deposition of conductive, semi-conductive, and non-conductive thin films. Surface contaminants to be removed may be in the form of organic materials, physical particulate contamination, oxides, or any unwanted material deposited, grown, or otherwise formed on the surface of the substrate. Surface treatment may be in the form of passivation (or removal) of weakly bonded surface species and unsatisfied surface bonding sites, and/or modification in texture, crystallographic orientation, morphology, or adhesion properties of the underlying film relative to the to-be deposited overlying film(s).

In particular, the present invention employs a halogen containing, or preferably hydrogen containing, radical and argon ions to clean and treat the bottoms and sidewalls of high aspect ratio features without redeposition of the removed contaminants or adverse changes in feature profiles. The method is in-situ, without air break, without substrate transfer under vacuum, and without significant change in hardware by utilizing the apparatus outlined in copending application Ser. No. 09/812,352 titled "System and Method for Modulated Ion-induced Atomic Layer Deposition (MII-ALD)", filed Mar. 19, 2001 (filed provisionally on Dec. 6, 2000 as Application No. 60/254,280) referred to herein as the "MII-ALD application" and which is hereby incorporated by reference in its entirety. The cleaning and surface treatment step is performed with either a halogen or hydrogen containing radical alone or preferably with simultaneous halogen or hydrogen containing radical and low energy ion bombardment of the substrate. An integrated in-situ, modulated ion-induced atomic layer deposition step (or series of deposition steps) can immediately follow with the application of a suitable precursor containing the principal element(s) desired in the end film (or tailored film stack of varying compositions or materials). The cleaning/surface treatment step may be performed periodically in between individual layers of either the same film or of films of varying composition or materials to enhance overall stack performance. Modulation of the cleaning/surface treatment and the deposition steps can be controlled via modulation of at least one of the following parameters: 1) the precursor flux, 2) the halogen or hydrogen containing radical flux, 3) the ion flux; or, 4) the ion energy. The cleaning/surface treatment and subsequent deposition steps can be performed at low substrate temperatures (i.e., generally less than or equal to 200° C.), making it compatible with low-k materials.

DETAILED DESCRIPTION OF THE PREFERRED EMBODIMENTS

Figure 1:
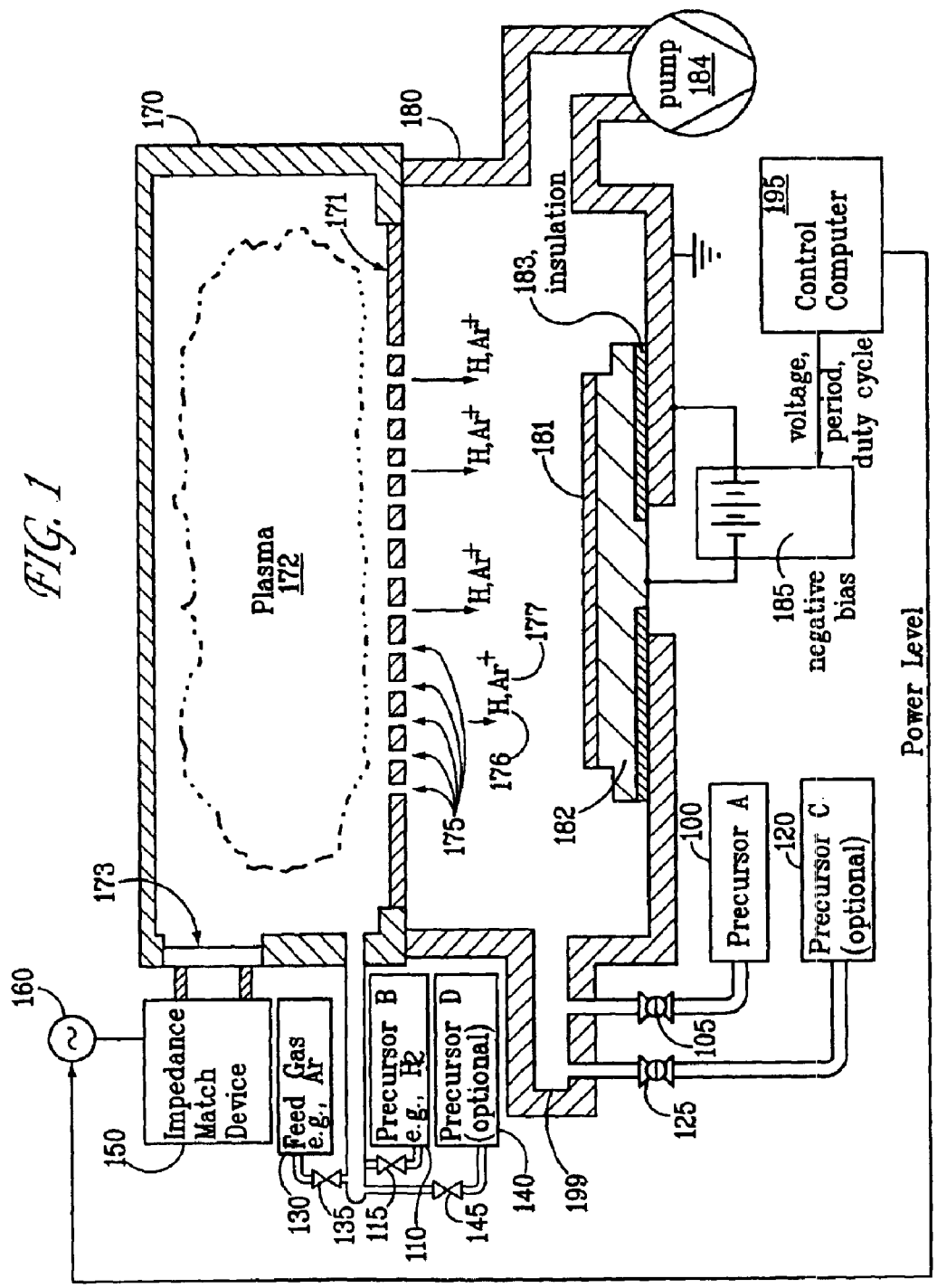
FIG. 1 is a deposition system suitable for modulated ion-induced atomic layer deposition (MII-ALD).

FIG. 1 illustrates an apparatus suitable for in-situ preclean/surface treatment followed by MII-ALD deposition. A description of the MII-ALD process and apparatus is described in the MII-ALD application and will not be repeated in detail here for brevity. Although the MII-ALD process can be sequential or continuous in nature, both processes involve the reaction of a first and second precursor subject to ion exposure such that the ions deliver the necessary activation energy required for deposition to the near surface atoms and adsorbed reactant(s) via collision cascades.

As discussed previously, the quality of a deposited film is significantly affected by the cleanliness of the substrate surface prior to deposition. Therefore, in practice, the MII- ALD process should be preceded by a surface cleaning step, most preferably in-situ. The MII-ALD process and associated apparatus, invoked in the absence of a first precursor, is an effective in-situ cleaning process and will be described infra. Deposition can then follow by introduction of the first precursor.

The integrated in-situ cleaning/surface treatment step is performed as follows. Invoking MII-ALD in the absence of a first precursor gas 100, argon 130 (Ar) and a suitable halogen containing feed gas 110 (e.g., $Cl_2$, $F_2$, $NF_3$, etc.), or preferably hydrogen feed gas 110, is introduced into the plasma generation chamber 170. Radio frequency (RF), (e.g., 400 KHz, 2 MHz, 13.56 MHz, 20 MHz, etc.) or preferably microwave power 160 (e.g., 2.45 GHz or higher frequencies) is applied to generate a plasma 172 to form argon ions 177 and halogen or hydrogen containing radicals 176 (i.e., second precursor or reactant) via dissociation of the feed gases 130, 110. Atomic hydrogen or halogen-containing radicals 176 will react with surface contaminants such as oxides to form oxygen containing gaseous byproducts, which can then easily be pumped 184 away. It is preferable to use hydrogen ($H_2$) as the radical feed gas 110 to form atomic hydrogen (H) radicals 176 since atomic hydrogen 176 can also serve as the reducing agent required during subsequent deposition of metal containing films via MII-ALD. In addition, atomic hydrogen 176 can be used to remove carbonaceous impurities via the formation of gaseous $CH_x$ species, which can then easily be pumped 184 away.

Preferably microwave power 160 is coupled to the plasma source chamber 170 via a waveguide, coaxial cable, or other suitable means with a suitable impedance matching device 150. Microwave energy can be more efficiently transferred to ionizing electrons, leading to improved ion 177 and radical 176 densities. This is especially true for atomic hydrogen 176 generation. Both the argon ions 177 and the H atoms 176 are delivered into the deposition chamber 180 and directed at the surface of the substrate 181 through the series of apertures 175 defined in the distribution showerhead 171, as is shown in FIG. 1. The deposition chamber 180 process pressure can be maintained in the range of $10^2$–$10^{-7}$ torr, more preferably in the range from $10^1$–$10^{-4}$ torr. The distribution showerhead 171 contains a series or array of apertures 175 through which ions 177 and radicals 176 are delivered to the substrate 181 and isolates the main process chamber 180 from the plasma source chamber 170 as is explained in the MII-ALD application.

The argon ions 177 aid in the removal of oxides, carbonaceous impurities, and other contaminants. Low energy ion 177 bombardment promotes surface reactions between the atomic hydrogen and oxides (and other contaminants) to form gaseous byproducts, which can then easily be pumped 184 away. The substrate 181 is biased to define the energy of the impinging ions 177. Direct current (DC) or RF (e.g., 400 KHz, 2 MHz, 13.56 MHz, etc.) power is used to bias the substrate pedestal 182. Preferably, the substrate pedestal 182 is an electrostatic chuck (ESC) to provide efficient coupling of bias voltage to the substrate 181. Typical substrate 181 bias voltages ($V_1$ in FIGS. 2A and 2C, 242, 282) can range from –10 V to –250 V, but preferably from –10 V to –100 V, and more preferably from –10 V to –50 V. Additionally, the magnitude and duty-cycle of any bias voltage may be modulated. The argon 130 to hydrogen 110 feed gas ratio is typically chosen to be less than or equal to 1, preferably less than or equal to 0.5. Both lower argon ion 177 fluxes and lower argon ion 177 energies reduce undesired faceting 315 of feature corners due to sputtering (see FIG. 3B). The substrate 181 is preferably maintained at less than or equal to 350° C., but is more preferably maintained at less than or equal to 200° C., making it compatible with extreme low-k materials. Low energy ion 177 bombardment enables effective cleaning/surface treatment at low substrate 181 temperatures.

The cleaning/surface treatment can also be performed in the absence of argon ions 177 by not flowing the argon feed gas 130. However, this may result in a lower dissociation fraction and hence reduced efficiency of atomic hydrogen 176 generation. In addition, the kinetics and hence efficiency of oxide and other contaminant removal may be decreased due to the absence of low energy ion 177 bombardment.

Once the oxide, carbonaceous impurities, or other surface contaminants have been removed, the first precursor 100 is introduced and subsequent film deposition is performed using, for example, the teachings of the MII-ALD application.

Figure 2A:
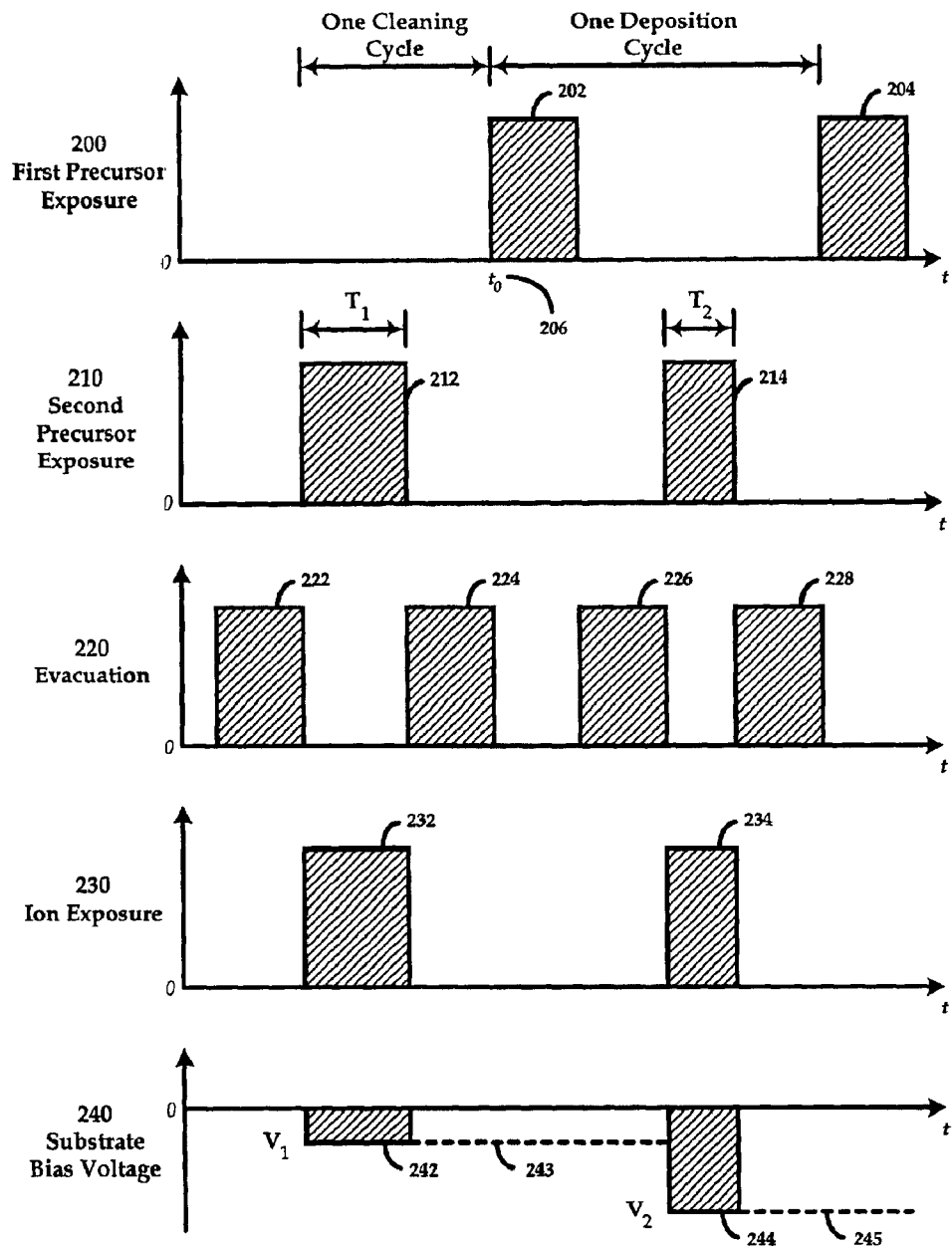
FIG. 2A is a typical sequential modulated ion-induced atomic layer deposition (MII-ALD) process sequence.

FIG. 2A shows a typical sequential modulated ion induced atomic layer deposition (MII-ALD) process sequence including an integrated in-situ cleaning step performed in the absence of a first precursor 100. The cleaning step terminates at $t_0$ 206 after which deposition begins. The dotted line 243, 245 indicates that the bias voltage doesn't necessarily have to be synchronized with the second precursor exposure 212, 214, but rather can remain at a constant value 242 until it needs to be changed to a different value, $V_2$ 244. The in-situ preclean is followed by sequential MII-ALD. The first and second precursors 202, 214 are sequentially introduced during each deposition cycle. The second precursor 214 (e.g., H atoms 176) exposure coincides with ion exposure 234 (e.g., $Ar^+$ 177) and the application of a substrate bias $V_2$ 244. The magnitude of the substrate bias $|V_1|$ 242 during cleaning is typically chosen to be lower than the magnitude of the substrate bias $|V_2|$ 244 during deposition in order to prevent faceting 315 of the features due to argon ion 177 sputtering during the cleaning cycle as shown in FIG. 3B. The argon ion 177 energies are determined by the applied substrate 181 bias. Typical substrate voltages $V_2$ 244 during deposition can range from –20 V to –1000 V, but preferably in the –25 V to –500 V range, and more preferably in the –50 V to –350 V range during deposition. A modulated DC or RF bias 185 (e.g., 400 KHz, 2 MHz, 13.56 MHz, etc.) can be used. The duration of the cleaning pulse $T_1$ 212 is typically less than or equal to 180 seconds, preferably from 5 seconds less than or equal to $T_1$ 212 less than or equal to 90 seconds, more preferably from 15 seconds less than or equal to $T_1$ 212 less than or equal to 60 seconds. The desired film thickness is obtained by repeating the deposition cycle the required number of times. The second precursor exposure duration, $T_2$ 214, may or may not be equal to $T_1$ 212.

Figure 2B:
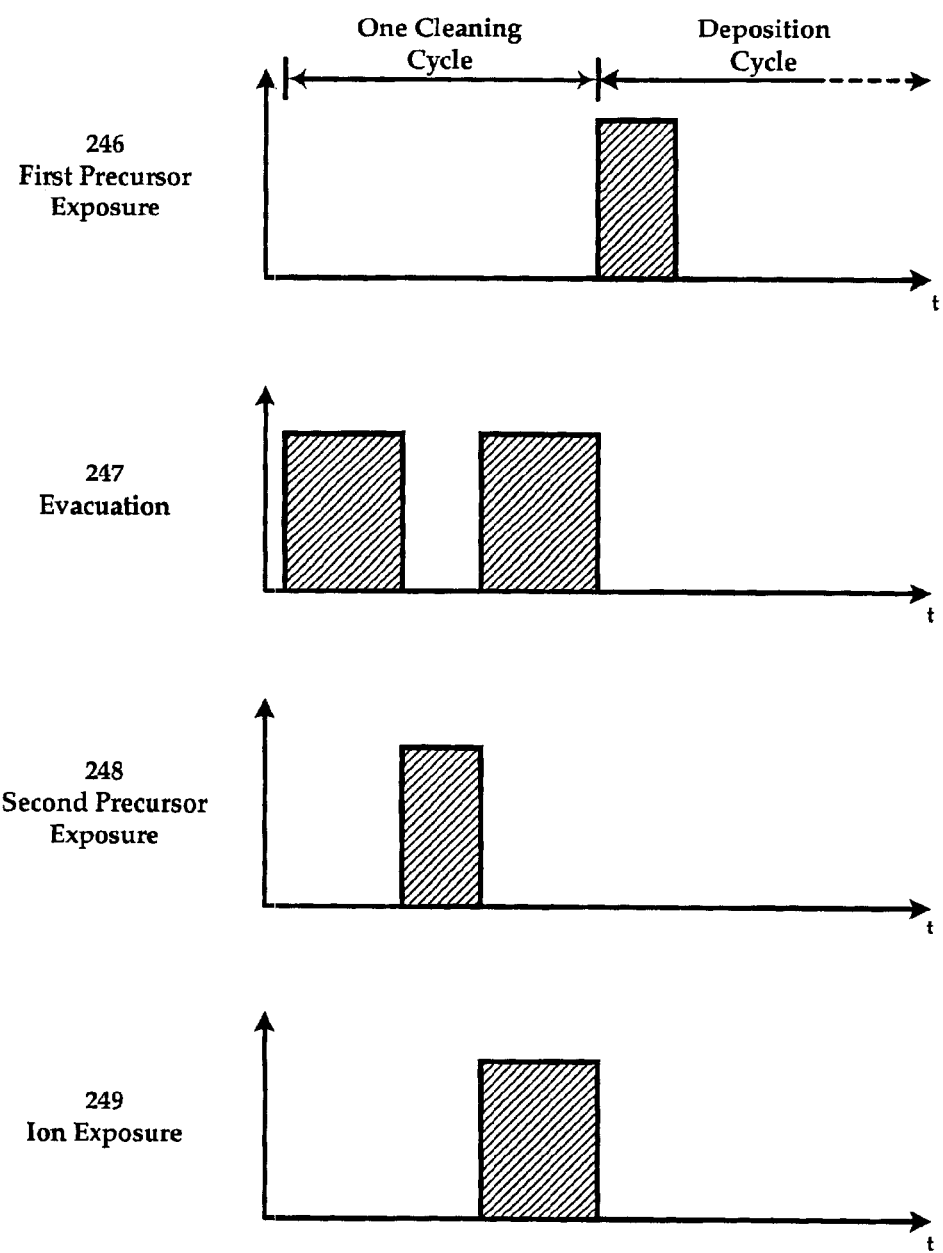
FIG. 2B is an alternative typical sequential modulated ion-induced atomic layer deposition (MII-ALD) process sequence.

A variant of the method shown in FIG. 2A is illustrated in FIG. 2B where ion exposure is initiated after the second precursor exposure. FIG. 2B depicts a sequence for an improved ALD method incorporating periodic exposure of the substrate 181 to ions 177.

Figure 2C:
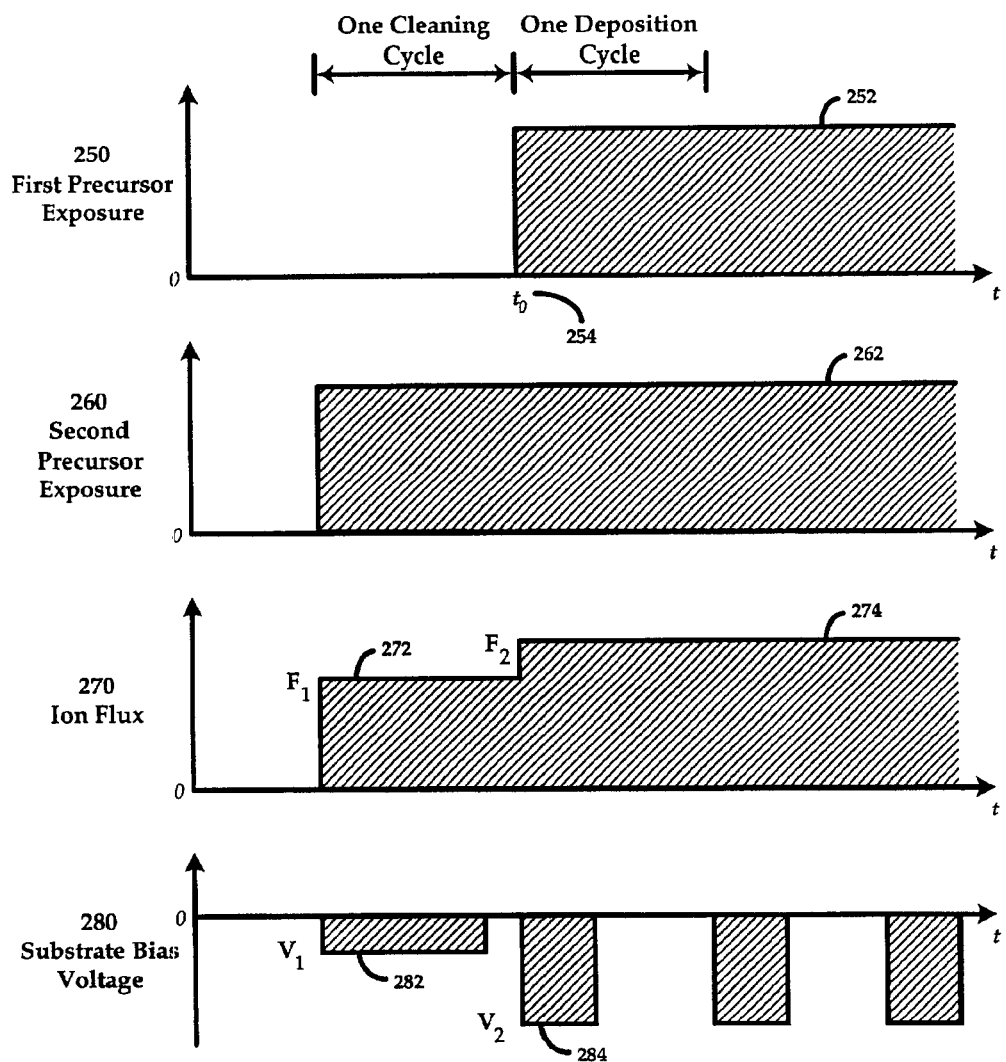
FIG. 2C is a typical non-sequential (continuous) modulated ion-induced atomic layer deposition (MII-ALD) process sequence.

FIG. 2C illustrates a preferred embodiment of the present invention whereby, an integrated in-situ cleaning or in-situ treatment step performed in the absence of a first precursor 100 is followed by subsequent non-sequential or continuous MII-ALD. The cleaning step terminates at $t_0$ 254 after which deposition begins. During the deposition cycle, instead of sequentially introducing precursors 100, 110, the substrate 181 is simultaneously exposed to a first 252 and second 262 reactant (i.e., precursors), and subjected to modulated ion 177 exposure. In FIG. 2C, the deposition is toggled "on" and "off" via modulation of the impinging ion 177 energy (preferably controlled via the applied substrate 181 bias) at a fixed plasma source 160 power. The desired film thickness is obtained via exposure of the substrate 181 to the suitable number of modulated ion energy pulse cycles. The magnitude of the substrate bias $|V_1|$ 282 during cleaning is typically chosen to be lower than the magnitude of the substrate bias $|V_2|$ 284 during deposition as explained earlier. The ion flux 270 during cleaning, $F_1$ 272, is typically chosen to be lower than the ion flux during deposition, $F_2$ 274, in order to prevent faceting 315 of the features due to sputtering (e.g., argon ion 177) during the cleaning cycle. Ion flux or energy modulation can vary generally from 0.1 Hz to 20 MHz. Additionally, a mechanical shutter may be used to periodically occlude the ion source, providing yet another way to vary the ion flux to the substrate. The ion flux 270 can be adjusted by increasing or decreasing the flow rate of the feed gas 130 (e.g., Ar) used for ion 177 generation. For example, a lower argon feed-gas 130 flow rate into the plasma source chamber 170 will result in a lower argon ion flux 270 at a given plasma source 160 power. In addition, the plasma source 160 power can also be increased or decreased to vary the ion flux 270, with higher source powers resulting in greater ion fluxes 270. The plasma source 160 power may be further varied in frequency, magnitude, duty-cycle, or any combination thereof.

Other variants and embodiments of the subsequent deposition are discussed in the copending MII-ALD application and will not be repeated here in detail for brevity.

Typically, the in-situ cleaning cycle is performed once, prior to the first deposition cycle. However, multiple cleaning cycles can also be used, each preceding one or more deposition cycle(s). One example is during the deposition of multilayer (e.g., $TaN_x/Ta$ or Ti/TiN, etc.) or multifilm (e.g., $TaN_x/Ta/Cu$ or Ti/TiN/W, etc.) stacks. Similarly, a deposition sequence can contain any number of interspersed cleaning steps, even for the deposition of a single film material.

In one embodiment of the present invention, the in-situ preclean process can be used to remove copper oxide from the bottoms of high aspect ratio single or dual damascene structures (e.g., trenches, vias, or stacked trenches over vias, etc.) used in copper metallization. Simultaneous exposure of the substrate to atomic hydrogen 176 and low energy argon ions 177 will lead to the removal of speed-limiting copper oxide via the formation of OH byproducts which can then easily be pumped 184 away.

Figure 3A:
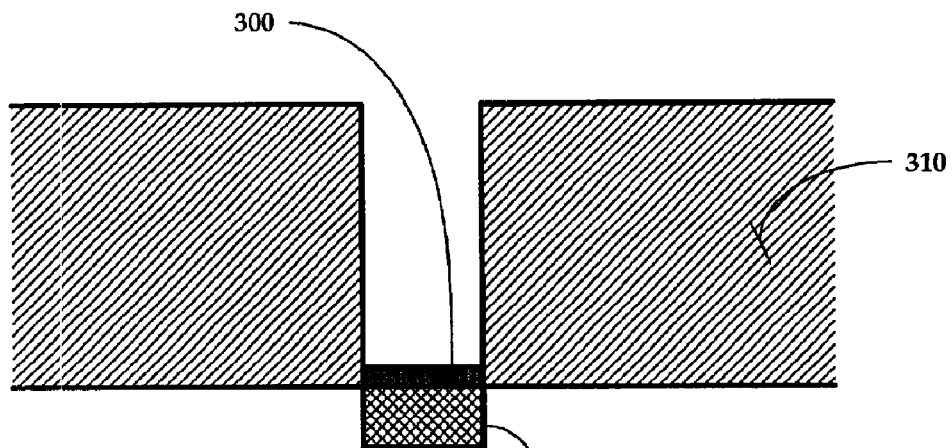
FIG. 3A is a high aspect ratio via containing an oxidized copper underlayer prior to preclean.
Figure 3B:
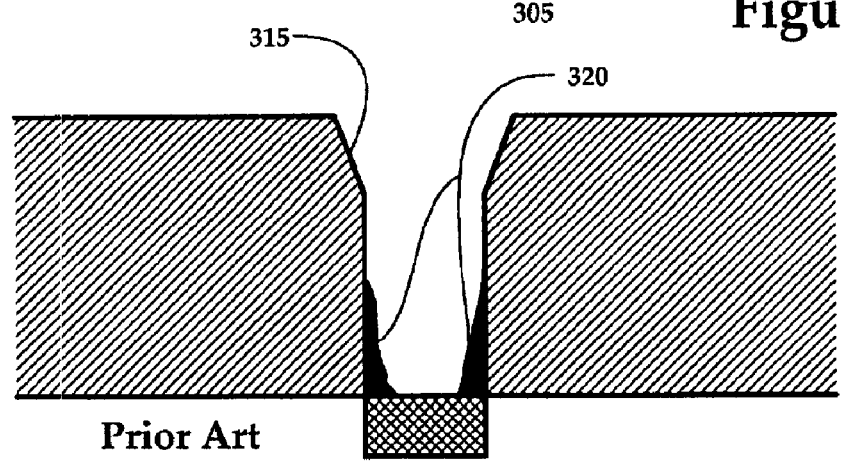
FIG. 3B is a high aspect ratio via showing sidewall redeposition of the sputtered copper oxide and tapering of via corners.
Figure 3C:
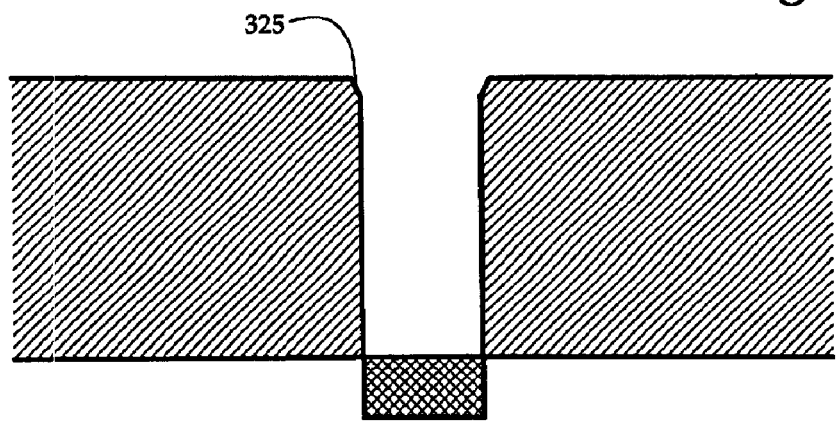
FIG. 3C is a high aspect ratio via showing the present invention where the copper oxide has been removed without sidewall redeposition and without adverse tapering of the via corners.

FIG. 3A illustrates a high aspect ratio via containing an oxidized 300 copper underlayer 305 prior to preclean. FIG. 3B shows a high aspect ratio via showing sidewall redeposition 320 of the sputtered copper oxide 300 removed from the bottom of the via and tapering of the via corners 315 due to excessive argon ion 177 sputtering (illustrating the issues associated with problems in the prior art). FIG. 3C shows a high aspect ratio via showing the present invention whereby the copper oxide 300 has been removed without sidewall redeposition 320 and without adverse tapering of the via corners 325. This same process can also remove carbonaceous impurities left behind during the etching of the vias (either along the sides or bottoms of the vias). Subsequent deposition of a barrier layer (e.g., Ta, $TaN_x$, etc.) via the introduction of a suitable tantalum containing precursor (e.g., $TaCl_5$, $TaBr_5$, etc.) can be performed via MII-ALD. The same atomic hydrogen 176 is now used as the reducing agent to form metallic Ta and byproducts (e.g., HCl or HBr), which can be readily pumped 184 away.

The in-situ preclean step can be repeated during the deposition of a barrier stack (e.g., $TaN_x/Ta$) using the following sequence:

1) Reactive preclean; followed by
2) $TaN_x$ deposition; followed by
3) Reactive preclean; followed by
4) Ta deposition;

or prior to deposition of a subsequent material such as the copper seed layer using the following sequence:

1) Reactive preclean; followed by
2) Barrier deposition; followed by
3) Reactive preclean; followed by
4) Copper seed layer deposition.

Figure 4A:
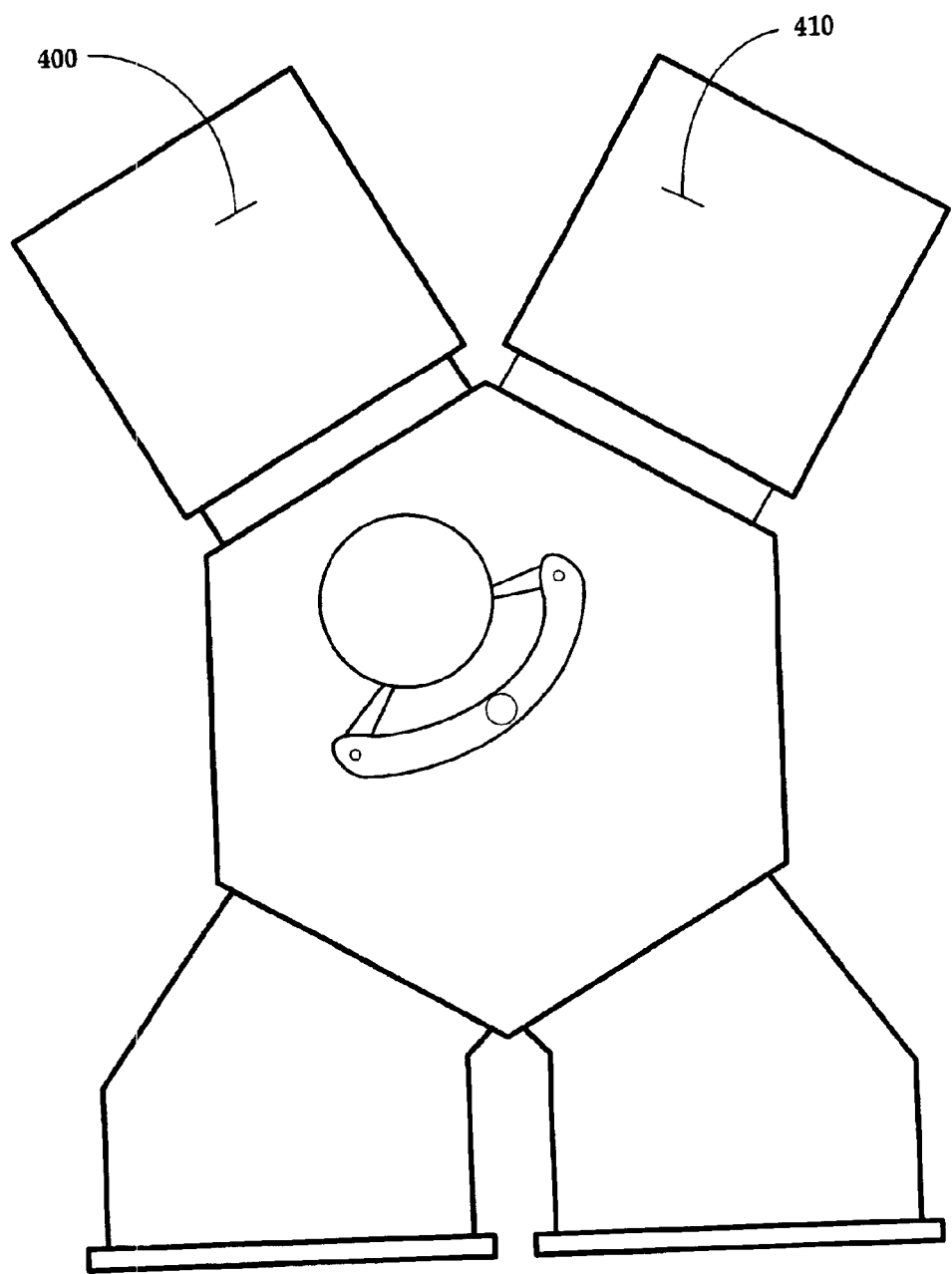
FIG. 4A is a schematic of the present invention illustrating a wafer processing system comprised of integrated in-situ cleaning and deposition chamber(s).
Figure 4B:
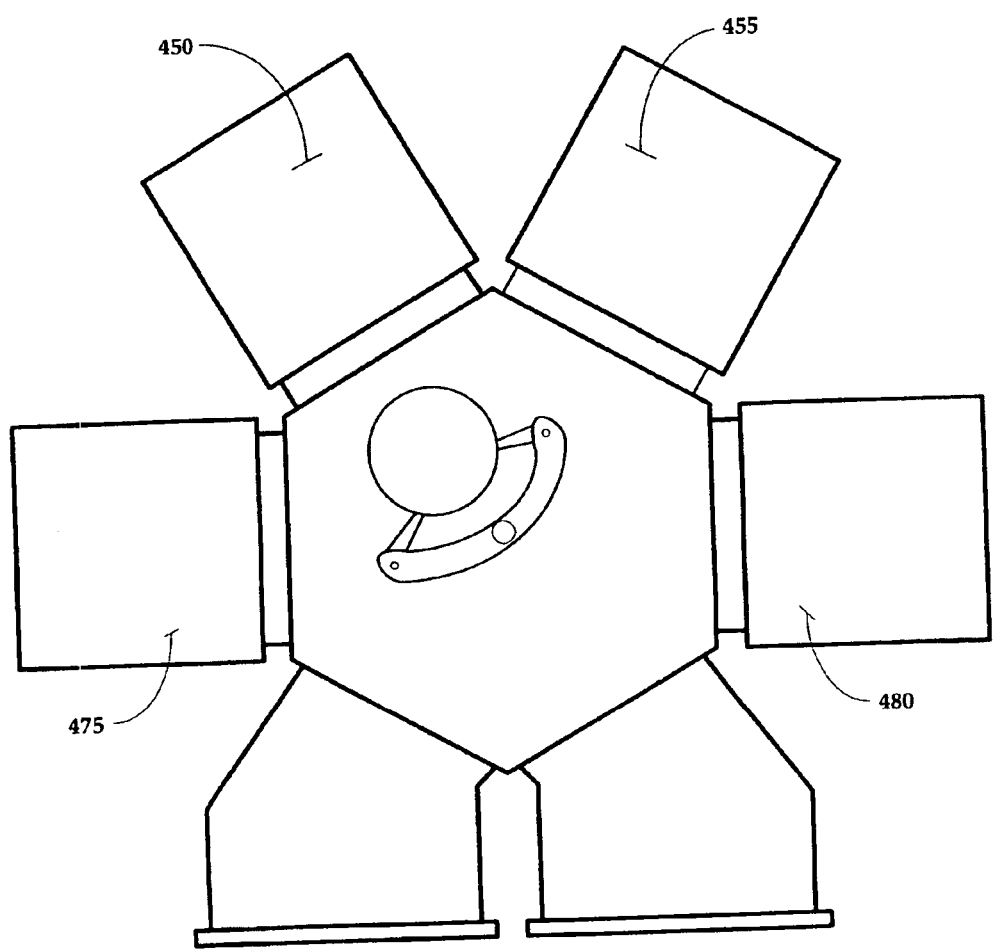
FIG. 4B is a schematic of the prior art illustrating a wafer processing system with separate cleaning and deposition chambers.

In both examples above, the clean and deposition sequence can be carried out within the same processing chamber 180. However, in the second example, the reactive preclean step immediately preceding the copper seed layer deposition, as well as the copper seed layer deposition step, can be performed in a separate MII-ALD chamber integrated in an apparatus enabling vacuum transfer of the substrates such that steps 1 and 2 can be carried out in the first integrated cleaning/deposition chamber 400 and steps 3 and 4 can be carried out in the second integrated cleaning/deposition chamber 410 using the integrated apparatus as shown in FIG. 4A. Since the deposition step immediately follows the in-situ reactive preclean step, no oxide or other impurities can form on the freshly cleaned substrate interfaces. This leads to improved electrical performance, reliability, adhesion, morphology, texture, and crystallographic orientation of the deposited films. These benefits cannot be achieved using the integrated apparatus used in the prior art as shown in FIG. 4B where the cleaning chamber 475 is separate from both the barrier 450 and the seed layer 455 chambers. Each substrate transfer leads to exposure of the substrate to background ambient gases (even at reduced atmosphere), which will adversely impact subsequent film deposition and hence, adversely affect resulting device performance. In addition, the overall system throughput is reduced by the added substrate transfers required. Additionally, system complexity is commensurately increased by the requirement for a separate preclean chamber(s) 475, 480.

Although the example given above relates to copper metallization, a similar integrated in-situ cleaning process can be used to remove any contaminants, such as aluminum and silicon oxides, from the bottoms of high aspect ratio features followed by the in-situ deposition of liner materials such as titanium, titanium nitride, etc. using a suitable titanium containing precursor (e.g., $TiCl_4$, etc.), atomic hydrogen 176, and modulated ion 177 exposure via MII-ALD (see FIG. 1).

Another embodiment of the present invention relates to in-situ surface treatment of patterned low-k features (e.g., high aspect ratio vias and trenches) prior to the subsequent deposition of overlying thin films (e.g., a barrier layer(s)). Atomic hydrogen 176 is effective at removing weakly bonded species and passivating unsatisfied surface bonding sites. Halogens are not used in this instance. As an example, atomic hydrogen 176 will getter loose interfacial fluorine to form HF, which can then be easily pumped 184 away. Fluorine can attack most metals, especially Ta containing metal or metal compounds. This is useful in the case of fluorinated low-k materials such as FSG. As another example, organosilicates (carbon-doped $SiO_2$) low-k materials use methyl (e.g., $CH_3$) groups to reduce the dielectric constant of standard $SiO_2$. However, surface $CH_x$ groups may be weakly bonded and/or possess unsatisfied bonds. Atomic hydrogen 176 can satisfy these bonding sites through the formation of hydrogen bonds, or remove weakly bonded species by forming CH$_4$, which can then easily be pumped 184 away. Weakly bonded interfacial species degrade the adhesion strength of the to-be deposited overlying film (e.g., a barrier layer(s)) to the dielectric, which can lead to barrier cracking, copper voiding during electroplating, and delamination during CMP. Atomic hydrogen 176 can remove weakly bonded surface species and/or passivate unsatisfied surface bonding sites of other types of low-k films containing carbon, fluorine, and hydrogen (e.g., hydrogenated carbon, fluorinated carbon, PTFE, or Teflon).

In addition, low-k materials absorb moisture (i.e., OH species) easily which deleteriously increases their effective dielectric constant, and, hence, the capacitance between conductive features surrounded by the dielectric material. Moreover, surface OH groups lead to poor interfacial adhesion. Atomic hydrogen 176 can improve adhesion by reacting with OH surface species to form water (H$_2$O) vapor, which can then be pumped 184 away. Once the low-k film has been treated, in-situ deposition within the same processing chamber 180, 400 can immediately follow via MII-ALD and the use of an appropriate precursor (e.g., TaCl$_5$ for a Ta containing barrier material). Since the surface treatment of the patterned low-k dielectric feature was performed in-situ, the subsequently deposited barrier material will have superior interfacial properties (e.g., adhesion, conductivity, reliability, etc.) as compared to prior art.

This description is illustrative and not limiting; further modifications will be apparent to one of ordinary skill in the art in the light of this disclosure and the appended claims.

What is claimed is:

1. A sequential method for integrated, in-situ modification of a substrate and subsequent atomic layer deposition of a thin film onto said substrate in an evacuated chamber beginning with initial modification steps, comprising:
   introducing at least one first ion generating feed gas into said evacuated chamber;
   generating a plasma from said first ion generating feed gas to form ions;
   exposing said substrate to said ions;
   modulating said ions;
   reacting said substrate with said modulated ions to remove any contaminants from said substrate and producing a modified substrate; and
   following said initial modification steps, performing an atomic layer deposition of a thin film onto said modified substrate in said evacuated chamber including:
   introducing a first reactant gas into said evacuated chamber;
   adsorbing at least one monolayer of said first reactant gas onto said modified substrate;
   evacuating any excess said first reactant gas from said evacuated chamber;
   introducing at least one additional ion generating feed gas into said evacuated chamber;
   generating a second plasma from said additional ion generating feed gas to form additional ions;
   exposing said modified substrate to said additional ions;
   modulating said additional ions; and
   reacting said adsorbed monolayer of said first reactant gas with said modulated additional ions to deposit said thin film.

2. The sequential method of claim 1 wherein said initial modification steps are cleaning steps.

3. The sequential method of claim 1 wherein said initial modification steps are surface treatment steps.

4. The sequential method of claim 1 wherein said initial modification steps additionally include introducing at least one radical generating feed gas into said evacuated chamber and generating a plasma from said radical generating feed gas to form radicals.

5. The sequential method of claim 1 wherein said atomic layer deposition steps additionally include introducing at least one radical generating feed gas into said evacuated chamber and generating a plasma from said radical generating feed gas to form radicals.

6. The sequential method of claim 1 wherein said contaminants comprise native oxides, metal oxides, particulate contamination, and carbon-containing impurities.

7. The sequential method of claim 1, wherein said ion modulation is modulated in a way selected from the group consisting of modulating an ion flux and modulating an ion energy.

8. The sequential method of claim 1, further comprising electrically biasing said substrate to a negative potential.

9. The sequential method of claim 8, wherein said electrical bias is induced by a radio frequency power supply.

10. The sequential method of claim 8, wherein a magnitude of said electrical bias during said initial cleaning steps is lower than a magnitude of said electrical bias during said atomic layer deposition steps.

11. The sequential method of claim 1 wherein said method is repeated for each film deposition layer.

12. The sequential method of claim 1 wherein a barrier material film is deposited following said initial modification steps.

13. The sequential method of claim 1 wherein a copper seed layer is deposited following said initial modification steps.

14. A sequential method for integrated, in-situ modification of a substrate and subsequent atomic layer deposition of a thin film onto said substrate in an evacuated chamber beginning with initial modification steps, comprising:
   introducing at least one first radical generating feed gas into said evacuated chamber;
   introducing at least one ion generating feed gas into said chamber;
   generating a plasma from said first radical generating feed gas to form radicals;
   exposing said substrate to said radicals;
   reacting said substrate with said radicals to remove any contaminants from said substrate and producing a modified substrate; and
   following said initial modification steps, performing an atomic layer deposition of a thin film onto said modified substrate in said evacuated chamber including:
   introducing a first reactant gas into said evacuated chamber;
   adsorbing at least one monolayer of said first reactant gas onto said modified substrate;
   evacuating any excess said first teactant gas from said evacuated chamber;
   introducing at least one additional radical generating feed gas into said evacuated chamber;
   generating a second plasma from said additional radical generating feed gas to form additional radicals;
   exposing said modified substrate to said additional radicals; and
   reacting said adsorbed monolayer of said first reactant gas with said additional radicals to deposit said thin film.

15. A sequential method for integrated, in-situ modification of a substrate and subsequent atomic layer deposition of a thin film onto said substrate in an evacuated chamber beginning with initial modification steps, comprising:

introducing at least one first radical generating feed gas into said evacuated chamber;

generating a plasma from said first radical generating feed gas to form radicals;

exposing said substrate to said radicals;

reacting said substrate with said radicals to remove any contaminants from said substrate and producing a modified substrate; and following said initial modification steps, performing an atomic layer deposition of a thin film onto said modified substrate in said evacuated chamber including:

introducing a first reactant gas into said evacuated chamber;

adsorbing at least one monolayer of said first reactant gas onto said modified substrate;

evacuating any excess said first reactant gas from said evacuated chamber;

introducing at least one additional radical generating feed gas into said evacuated chamber;

generating a second plasma from said additional radical generating feed gas to form additional radicals;

exposing said modified substrate to said additional radicals;

reacting said adsorbed monolayer of said first reactant gas with said additional radicals to deposit said thin film; and repeating each of the aforementioned steps for each film deposition layer.

16. The sequential method of claim 1 wherein said additional radical generating feed gas is the same feed gas as said first radical generating feed gas.

17. The sequential method of claim 14 wherein said additional radical generating feed gas is the same feed gas as said first radical generating feed gas.

18. The sequential method of claim 15 wherein said additional radical generating feed gas is the same feed gas as said first radical generating feed gas.

* * * * *